(12) United States Patent
Rudelic

(10) Patent No.: US 8,078,796 B2
(45) Date of Patent: Dec. 13, 2011

(54) METHOD FOR WRITING TO AND ERASING A NON-VOLATILE MEMORY

(75) Inventor: John Rudelic, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 422 days.

(21) Appl. No.: 12/423,226

(22) Filed: Apr. 14, 2009

(65) Prior Publication Data

US 2010/0262756 A1 Oct. 14, 2010

(51) Int. Cl.
*G06F 12/00* (2006.01)

(52) U.S. Cl. .......................................... 711/103; 711/167

(58) Field of Classification Search .................. 711/103, 711/167

See application file for complete search history.

(56) References Cited

U.S. PATENT DOCUMENTS 6,973,530 B2 * 12/2005 Hurich ......................... 711/103

* cited by examiner

*Primary Examiner* — Son Dinh
*Assistant Examiner* — Nam Nguyen
(74) *Attorney, Agent, or Firm* — Schwegman, Lundberg & Woessner, P.A.

(57) ABSTRACT

A method for writing to and erasing a non-volatile memory is described. The method includes determining the size of a command window for use in n write operations for the non-volatile memory, each write operation having the same time period. A long latency erase command is sliced by a factor of n to provide a plurality of erase slices, each erase slice having the same time period. The method further includes executing n commands to the non-volatile memory, each command composed of the combination of one of the n write operations and one of the erase slices. The total of the time period of one erase slice added to the time period of one write operation is less than or equal to the size of the command window.

20 Claims, 5 Drawing Sheets

METHOD FOR WRITING TO AND ERASING A NON-VOLATILE MEMORY

TECHNICAL FIELD

Embodiments of the invention are in the field of non-volatile memories and, in particular, computer-implemented methods for writing to and erasing a non-volatile memory.

BACKGROUND

Several non-volatile memory applications, such as a high density subscriber identity module (HD-SIM) cards, have strict command timings that are significantly less than the time of a typical flash device, e.g. a 'not OR' (NOR) device, erase operation. Additionally, in some applications, the power to an associated flash device is removed between flash commands, leaving little to no opportunity to perform background erase operations as is traditionally performed for many applications. Attempts have been made to reduce NOR erase times to make NOR memories more practical for applications such as HD-SIM cards. However, additional improvements are needed in the evolution of methods for writing to and erasing a non-volatile memory, such as a NOR flash memory.

DETAILED DESCRIPTION

Figure 1:
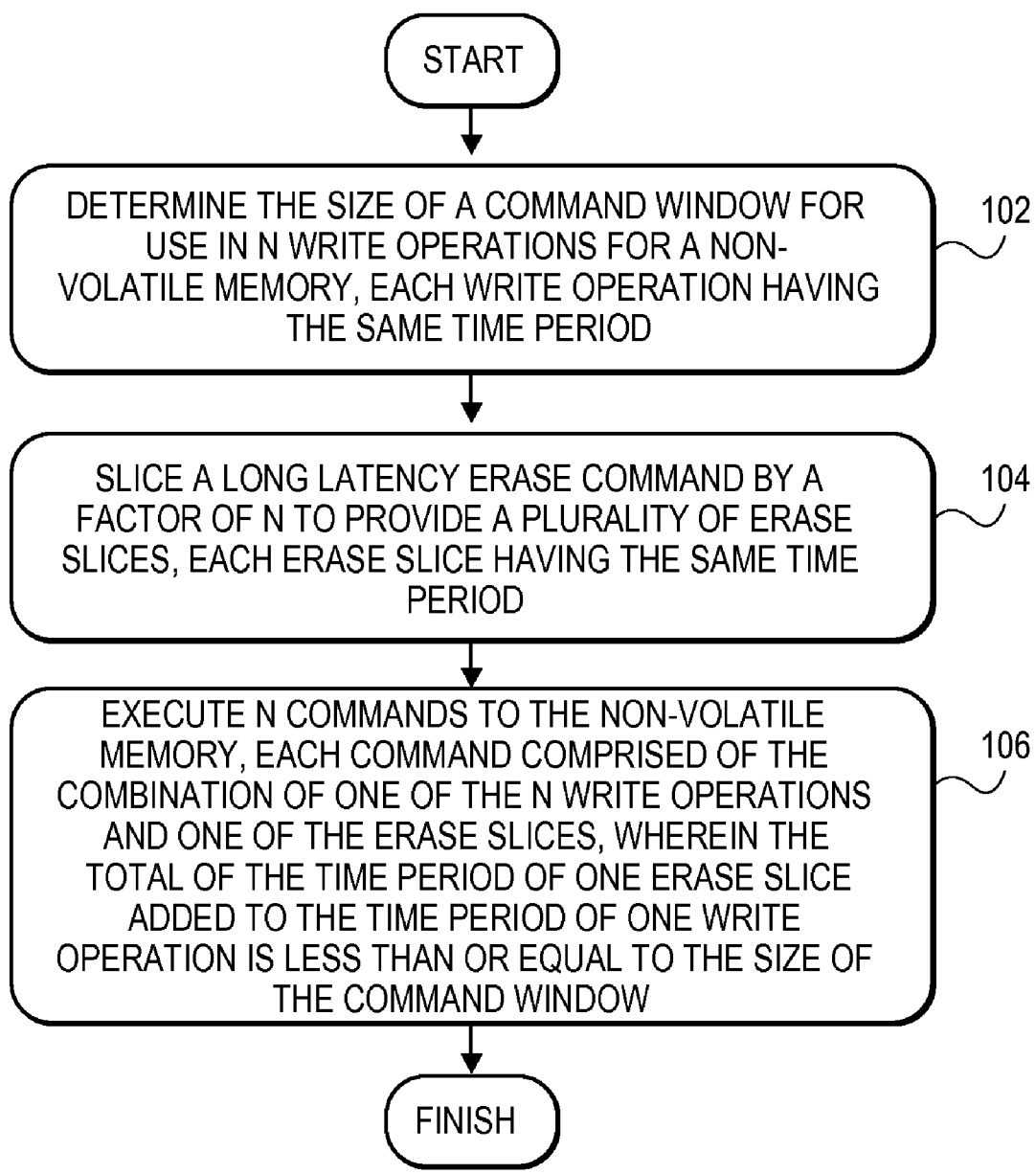
FIG. 1 illustrates a Flowchart representing operations in a computer-implemented method for writing to and erasing a non-volatile memory, in accordance with an embodiment of the present invention.

A method for writing to and erasing a non-volatile memory is described herein. In the following description, numerous specific details are set forth, such as specific erase slice times, in order to provide a thorough understanding of embodiments of the present invention. It will be apparent to one skilled in the art that embodiments of the present invention may be practiced without these specific details. In other instances, well-known processing operations, such as determining clean versus dirty space in a non-volatile memory, are not described in detail in order to not unnecessarily obscure embodiments of the present invention. Furthermore, it is to be understood that the various embodiments shown in the Figures are illustrative representations and are not necessarily drawn to scale.

Disclosed herein is a computer-implemented method for writing to and erasing a non-volatile memory. In one embodiment, the method includes determining the size of a command window for use in n write operations for the non-volatile memory, each write operation having the same time period. A long latency erase command is sliced by a factor of n to provide a plurality of erase slices, each erase slice having the same time period. The method further includes executing n commands to the non-volatile memory, each command composed of the combination of one of the n write operations and one of the erase slices. The total of the time period of one erase slice added to the time period of one write operation is less than or equal to the size of the command window. In another embodiment, a computer-implemented method for writing to and erasing a non-volatile memory includes dynamically determining the size of a command window for use in n write operations for the non-volatile memory. Each write operation has the same time period and the dynamically determining is based on a dynamic latency erase command. The dynamic long latency erase command is sliced by a factor of n to provide a plurality of erase slices, each erase slice having the same time period. The dynamic long latency erase command is based on an actual state of the non-volatile memory. The method further includes executing n commands to the non-volatile memory, each command composed of the combination of one of the n write operations and one of the erase slices. The total of the time period of one erase slice added to the time period of one write operation is less than or equal to the size of the command window.

In accordance with an embodiment of the present invention, a computer-implemented method for writing to and erasing a non-volatile memory hides or replaces long latency erase operations within shorter read and write operations. In an embodiment, the latency of the erase operation is overcome by splitting the erase operation into a time slice that can be added to a plurality of write commands to fit within the timing envelope of a general write command. In one embodiment, the write command will take longer due to the added erase time but will actually still take less time than the typically tight command time. As such, a complete erase operation may be completed after multiple write commands, providing the ability to drop a latent erase command.

In an embodiment, by applying the approach of erase slicing, NOR flash can be used in applications that it would otherwise not be accepted in because of the conventionally long erase time. For example, NOR and to a lesser extent 'not AND' (NAND) erase times are typically much longer than write times. There may be some applications that cannot handle such an erase latency. In conventional approaches, the erase is pushed to the background and allowed to run to completion. However, such an approach may require that a device be powered on and idle. In accordance with an embodiment of the present invention, by applying an approach of erase slicing, NOR flash can be used in applications that neither provide idle background time nor provide power during an idle. In other embodiments, by applying an approach of erase slicing, certain flash memory configurations can be implemented in systems that have tight timing constraints on command time-outs that do not support the latency of a conventional erase cycle. In an embodiment, NOR flash is implemented in applications that aggressively control power and command timings where conventionally-operated flash would otherwise not be acceptable.

A computer-implemented method may be executed for writing to and erasing a non-volatile memory. FIG. 1 illustrates a Flowchart 100 representing operations in a computer-implemented method for writing to and erasing a non-volatile memory, in accordance with an embodiment of the present invention.

Referring to operation 102 of Flowchart 100, a computer-implemented method for writing to and erasing a non-volatile memory includes determining the size of a command window for use in n write operations for the non-volatile memory. In an embodiment, each write operation has the same time period. In accordance with an embodiment of the present invention, the non-volatile memory is a NOR flash memory.

Referring to operation 104 of Flowchart 100, the method includes slicing a long latency erase command by a factor of n to provide a plurality of erase slices. In an embodiment, each erase slice has the same time period.

Referring to operation 106 of Flowchart 100, the method includes executing n commands to the non-volatile memory, each command composed of the combination of one of the n write operations and one of the erase slices. In an embodiment, the total of the time period of one erase slice added to the time period of one write operation is less than or equal to the size of the command window. In one embodiment, the total of the time period of one erase slice added to the time period of one write operation is less than the size of the command window. In accordance with an embodiment of the present invention, n is equal to 10, the size of the command window is approximately 72 milliseconds, the time period of one erase slice is approximately 70 milliseconds, and the time period of one write operation is approximately 2 milliseconds. However, it is to be understood that a slicing approach is not limited these specific parameters. Furthermore, it is to be understood that the command is not limited to a write operation, but the erase slice could instead be added to, e.g., a read command.

Figure 2:
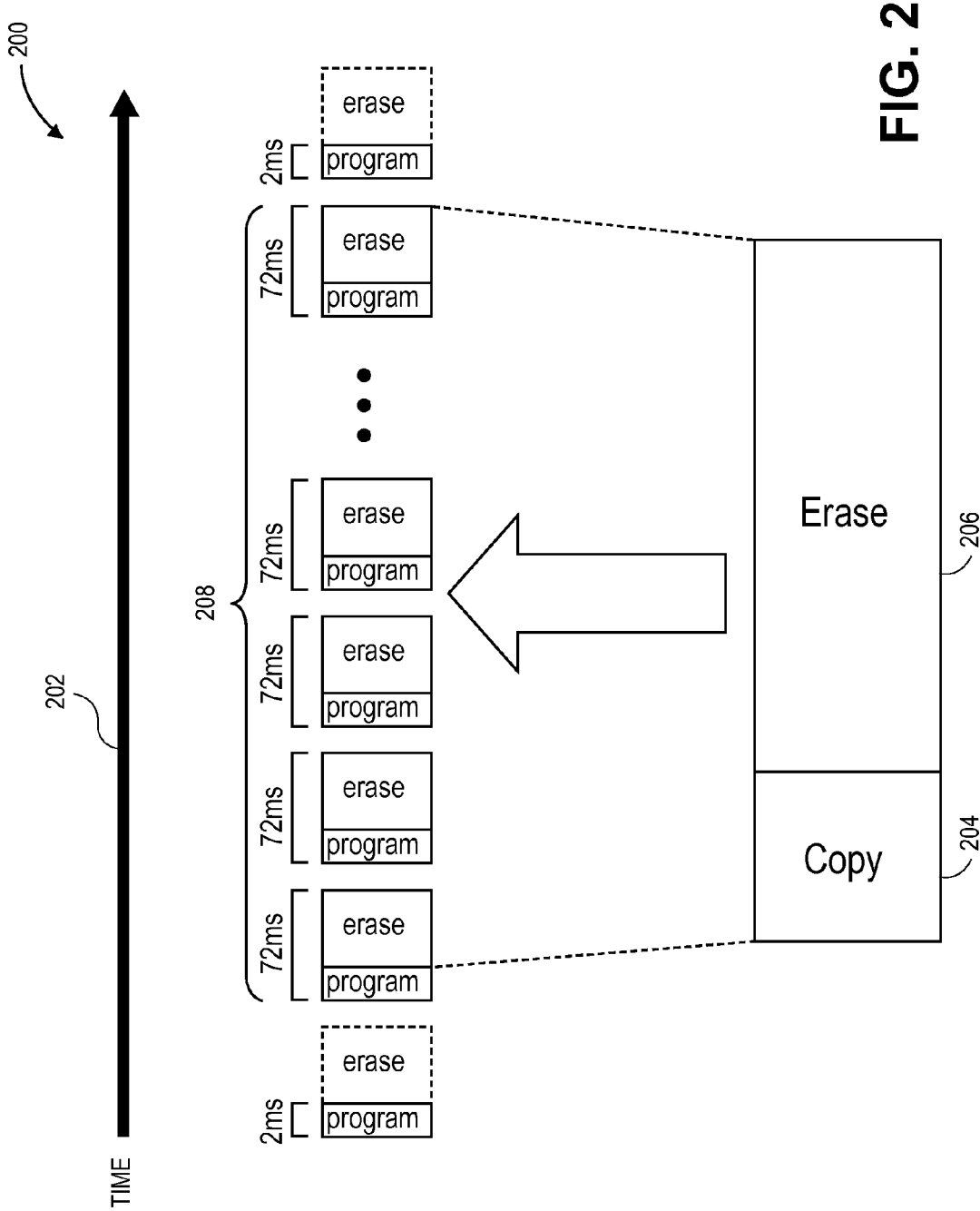
FIG. 2 illustrates conceptually, in block diagram format, a computer-implemented method for writing to and erasing a non-volatile memory, in accordance with an embodiment of the present invention.

An erase window slicing approach may be visualized with respect to a timeline. FIG. 2 illustrates conceptually, in block diagram format, a computer-implemented method for writing to and erasing a non-volatile memory, in accordance with an embodiment of the present invention.

Referring to FIG. 2, a block diagram timeline 200 includes a linear timeline 202 representing approximately relative absolute times for a conventional copy command 204 and a subsequent conventional latent erase command 206. In an embodiment, the conventional latent erase command is a long latency operation for reclaim and is typically performed in an otherwise background idle time. However, in accordance with an embodiment of the present invention, an erase slicing approach is implemented, the erase slicing taking the long latency reclaim operation of the conventional latent erase command 206 and slicing it across a plurality of multiple write (program) operations 208. Thus, in an embodiment, a method to eliminate the long latency erase command 206 is performed by dividing the erase time into erase slices that are then added to write operations. In one embodiment, a write (program) command window is, e.g., 100 milliseconds, so a conventional erase command of, e.g., 700 milliseconds will not fit into a single write (program) command window. So, in an embodiment, the 700 milliseconds erase time is divided into 10 slices of 70 milliseconds each. In that embodiment, each 70 milliseconds erase slice can be added to 10 corresponding 2 milliseconds write (program) time periods for a total time of 72 milliseconds for each command, as depicted in FIG. 2. The total time of 72 milliseconds for each a write (program) command fits into a command window of 100 milliseconds.

As described above, there are some systems that cannot handle a long-latency erase time associated with, e.g., NOR flash. As an example, HD-SIM cards that use NOR may need to use the above described erase slicing approach to allow for compatibility with HD-SIM-type applications. In an embodiment, erase slicing breaks a long latency erase operation into multiple segments that are added to write commands. In that embodiment, the erase time is made to effectively disappear. It is noted however, that the erase slicing described to this point has been focused on fixed size erase slicing. In such embodiments, the same erase time duration gets added to each write command. In other embodiments of the present invention, as described below, methods are implemented which vary the erase time slice size to match the erase backlog time. In an embodiment, such a dynamic approach is more responsive to a particular actual state of a system, a type of real-time approach to erase time slicing.

In accordance with an embodiment of the present invention, dynamic erase slicing is implemented by increasing the erase time allocated to an erase slice as dirty space (space requiring erasing) increases. In an embodiment, the dynamic approach increases the performance of a particular system which incorporates the non-volatile memory configured to perform dynamic erase time slicing. In one embodiment, a dynamic approach is based on a technique for varying the size of the erase time slice such as, but not limited to, allowing a host to increase the time allocated to erase as conditions warrant, automatically increasing an erase time as an erase backlog increases, or providing a recommendation to a host for increasing an erase time as the erase backlog increases. In an embodiment, the above described fixed size erase slicing is configured to add the same erase time to all write commands. However, under a dynamic approach, as is described in greater detail below, a host is enabled to increase or decrease or automatically increases or decreases the size of the time period of an erase slice as the erase backlog increases or decreases.

In an embodiment, when there is a significant amount of free space relative to the density of a managed area in a non-volatile memory, a system can decrease the time allocated to erase slice size to improve the apparent performance of the write commands. In contrast, in another embodiment, as the amount of free space relative to the density of a managed area in a non-volatile memory is small, a system can increase the time allocated to erase slice size in order to help prevent a flash full situation. Thus, in an embodiment, different from the above described fixed erase time slicing, dynamic erase time slicing allows a system to respond to the actual state of a non-volatile memory, such as a NOR flash memory. In one embodiment, dynamic erase slicing allows the erase slice time to be increased or decreased based on the state of the flash memory. In a specific embodiment, if the state of the flash memory has significant free space, then the erase time slice can be decreased to improve the performance of a system. By contrast, in an alternative specific embodiment, if the state of the flash memory has significant dirty space, then the erase time slice can be increased to allow more erase time. In an embodiment, implementing dynamic erase time slicing helps to prevent an erase operation from causing errors in applications such as HD-SIM cards that have a very tight window for command operations. In an embodiment, by helping prevent errors associated with the long-latency of erase operations, NOR flash can be implemented into applications for which it would otherwise not be suited.

Figure 3:
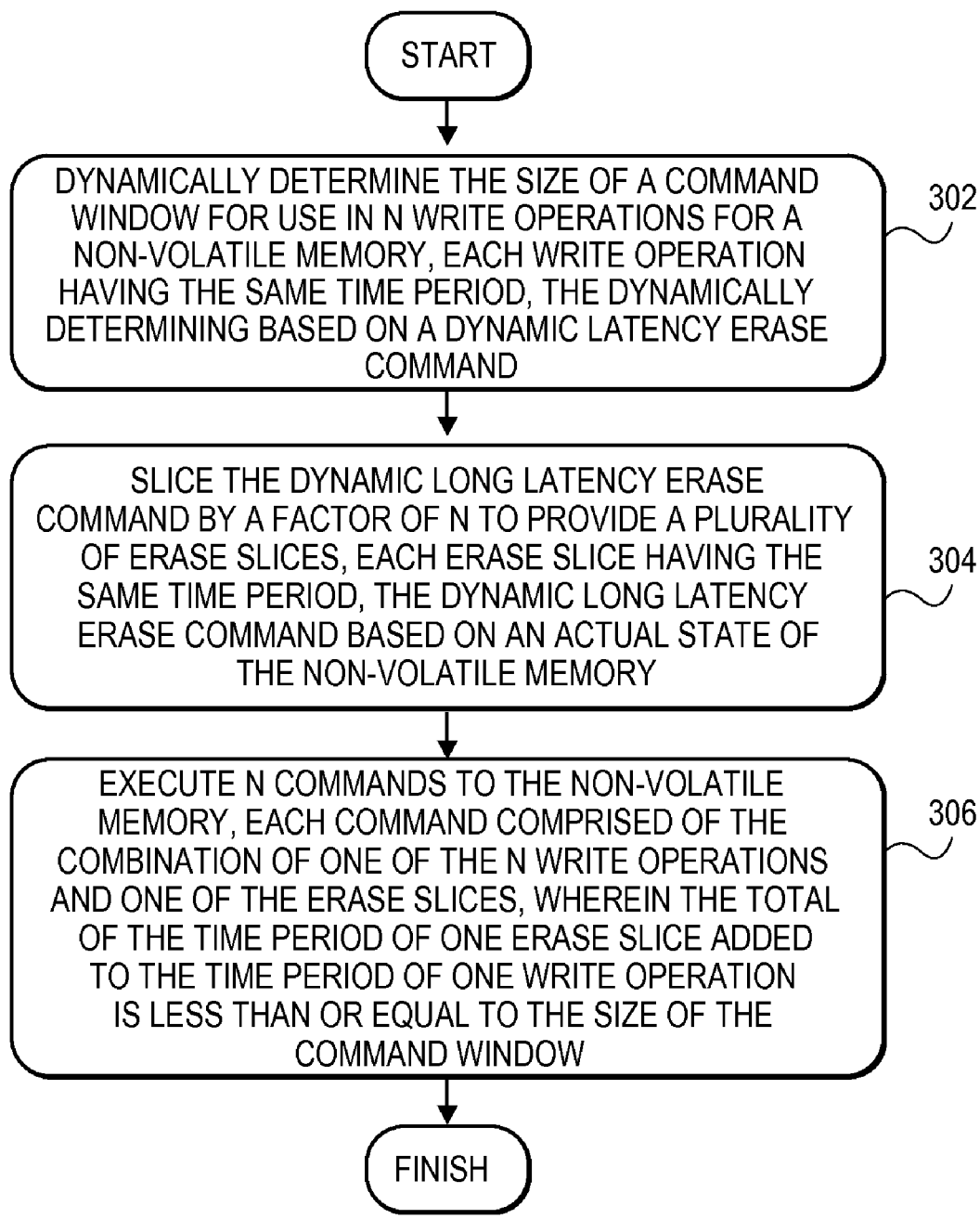
FIG. 3 illustrates a Flowchart representing operations in a computer-implemented method for dynamically writing to and erasing a non-volatile memory, in accordance with an embodiment of the present invention.

Accordingly, a computer-implemented method may be executed for dynamically writing to and erasing a non-volatile memory. FIG. 3 illustrates a Flowchart 300 representing operations in a computer-implemented method for dynamically writing to and erasing a non-volatile memory, in accordance with an embodiment of the present invention.

Referring to operation 302 of Flowchart 300, a computer-implemented method for writing to and erasing a non-volatile memory includes dynamically determining the size of a command window for use in n write operations for the non-volatile memory. In an embodiment, each write operation has the same time period and the dynamically determining is based on a dynamic latency erase command. In accordance with an embodiment of the present invention, the non-volatile memory is a NOR flash memory.

Referring to operation 304 of Flowchart 300, the method includes slicing the dynamic long latency erase command by a factor of n to provide a plurality of erase slices. In an embodiment, each erase slice has the same time period and the dynamic long latency erase command is based on an actual state of the non-volatile memory. In accordance with an embodiment of the present invention, the actual state of the non-volatile memory is composed of a small erase backlog and the dynamic latency erase command is approximately 500 milliseconds. In accordance with another embodiment of the present invention, the actual state of the non-volatile memory is composed of a large erase backlog, and the dynamic latency erase command is approximately 1500 milliseconds. In one embodiment, an access array is used to determine which sectors of the non-volatile memory are dirty, and thus is implemented to determine the actual state of the non-volatile memory. In a specific embodiment, the access array is provided in tables stored in an associated random-access memory (RAM). However, in another specific embodiment, the access array is provided in tables stored in an associated device or region other than an associated RAM.

Referring to operation 306 of Flowchart 300, the method includes executing n commands to the non-volatile memory, each command composed of the combination of one of the n write operations and one of the erase slices. In an embodiment, the total of the time period of one erase slice added to the time period of one write operation is less than or equal to the size of the command window. In one embodiment, the total of the time period of one erase slice added to the time period of one write operation is less than the size of the command window. In accordance with an embodiment of the present invention, n is equal to 10, the size of the command window is approximately 52 milliseconds, the time period of one erase slice is approximately 50 milliseconds, and the time period of one write operation is approximately 2 milliseconds. In another embodiment, n is equal to 10, the size of the command window is approximately 152 milliseconds, the time period of one erase slice is approximately 150 milliseconds, and the time period of one write operation is approximately 2 milliseconds. However, it is to be understood that a slicing approach is not limited the specific parameters provided in either embodiment. Furthermore, it is to be understood that the command is not limited to a write operation, but the erase slice could instead be added to, e.g., a read command.

Figure 4:
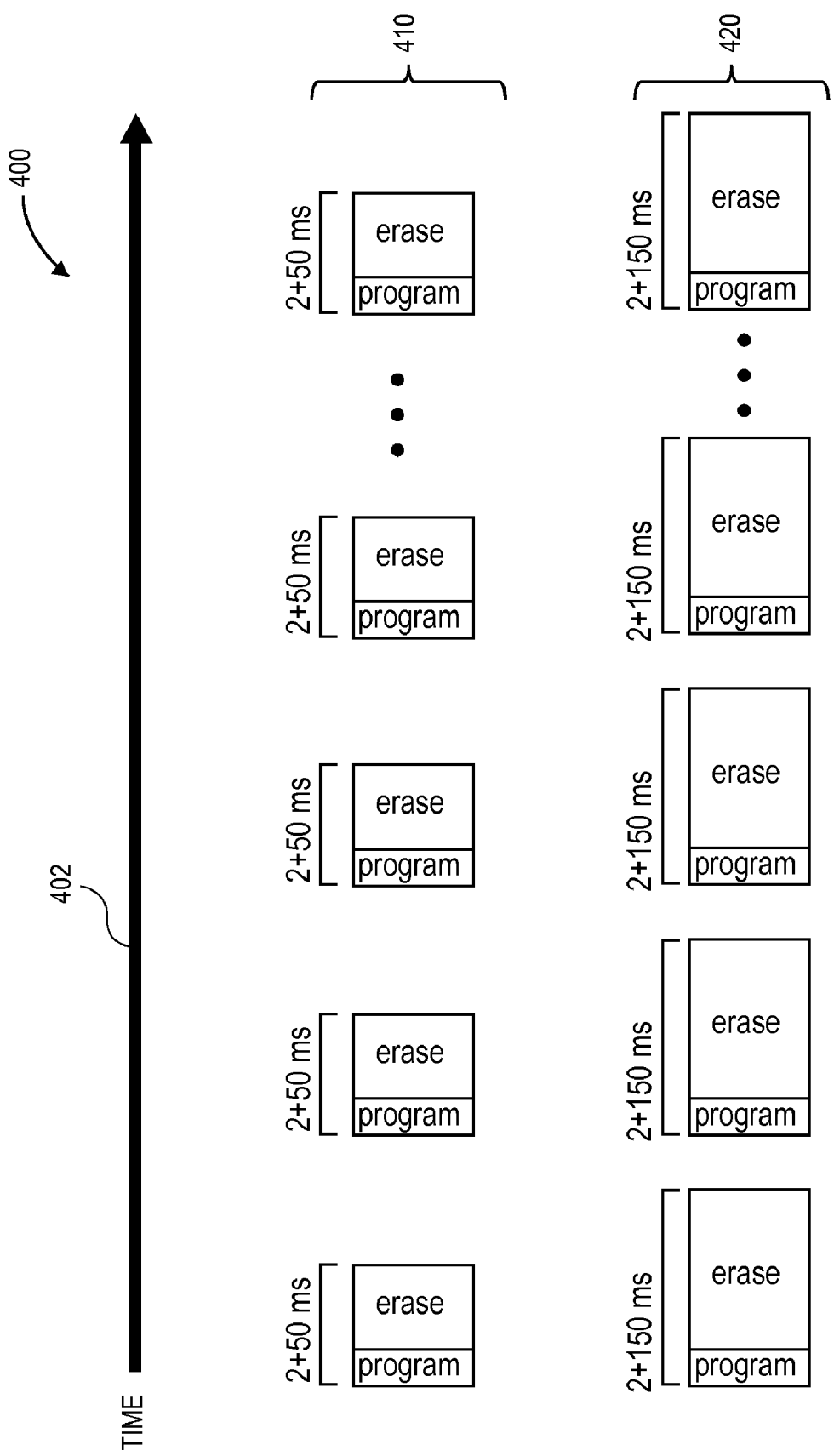
FIG. 4 illustrates conceptually, in block diagram format, a computer-implemented method for dynamically writing to and erasing a non-volatile memory, in accordance with an embodiment of the present invention.

A dynamic erase window slicing approach may be visualized with respect to a timeline. FIG. 4 illustrates conceptually, in block diagram format, a computer-implemented method for dynamically writing to and erasing a non-volatile memory, in accordance with an embodiment of the present invention.

Referring to FIG. 4, a block diagram timeline 400 includes a linear timeline 402 representing approximately relative absolute times for two different dynamic slicing implementations 410 and 420. Recall from FIG. 2 that, in an embodiment of the present invention, an erase slicing approach takes the long latency reclaim operation of a conventional latent erase command and slices it across a plurality of multiple write (program) operations. In the present embodiment, the size of the slice is determined dynamically and will differ in various situations, depending upon the actual state (e.g., amount of dirty space) of the non-volatile memory. However, in any of such embodiments, a method to eliminate the long latency erase command is still performed by dividing the erase time into erase slices that are then added to write operations.

In one embodiment, a 500 milliseconds erase time (less dirty non-volatile memory) is divided into 10 slices of 50 milliseconds each. In that embodiment, each 50 milliseconds erase slice can be added to 10 corresponding 2 milliseconds write (program) time periods for a total time of 52 milliseconds for each command, as is depicted in the plurality of command windows 410 of FIG. 4. In a different embodiment, a 1500 milliseconds erase time (more dirty non-volatile memory) is divided into 10 slices of 150 milliseconds each. In that embodiment, each 150 milliseconds erase slice can be added to 10 corresponding 2 milliseconds write (program) time periods for a total time of 152 milliseconds for each command, as is depicted in the plurality of command windows 420 of FIG. 4. Thus, in accordance with an embodiment of the present invention, the size of each of a plurality of program windows is determined dynamically based on the actual state of the non-volatile memory to which the plurality of program commands is applied. For example, in one embodiment, there is a small erase backlog and the slice time can be reduced to provide a perceived improvement in performance of the program commands. In another embodiment, there is a large erase backlog and the slice time is increased to decrease the chance of a foreground erase event.

In an embodiment, the present invention is provided as a computer program product, or software product, that includes a machine-readable medium having stored thereon instructions, which is used to program a computer system (or other electronic devices) to perform a process according to embodiments of the present invention. A machine-readable medium may include any mechanism for storing or transmitting information in a form readable by a machine (e.g., a computer). For example, in an embodiment, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc. In an embodiment, use of the term "computer-implemented" herein means processor-implemented. In one embodiment, one of the methods described herein is implemented in a portable device, such as a cellular phone, which does not have a computer per se but does have a processor.

Figure 5:
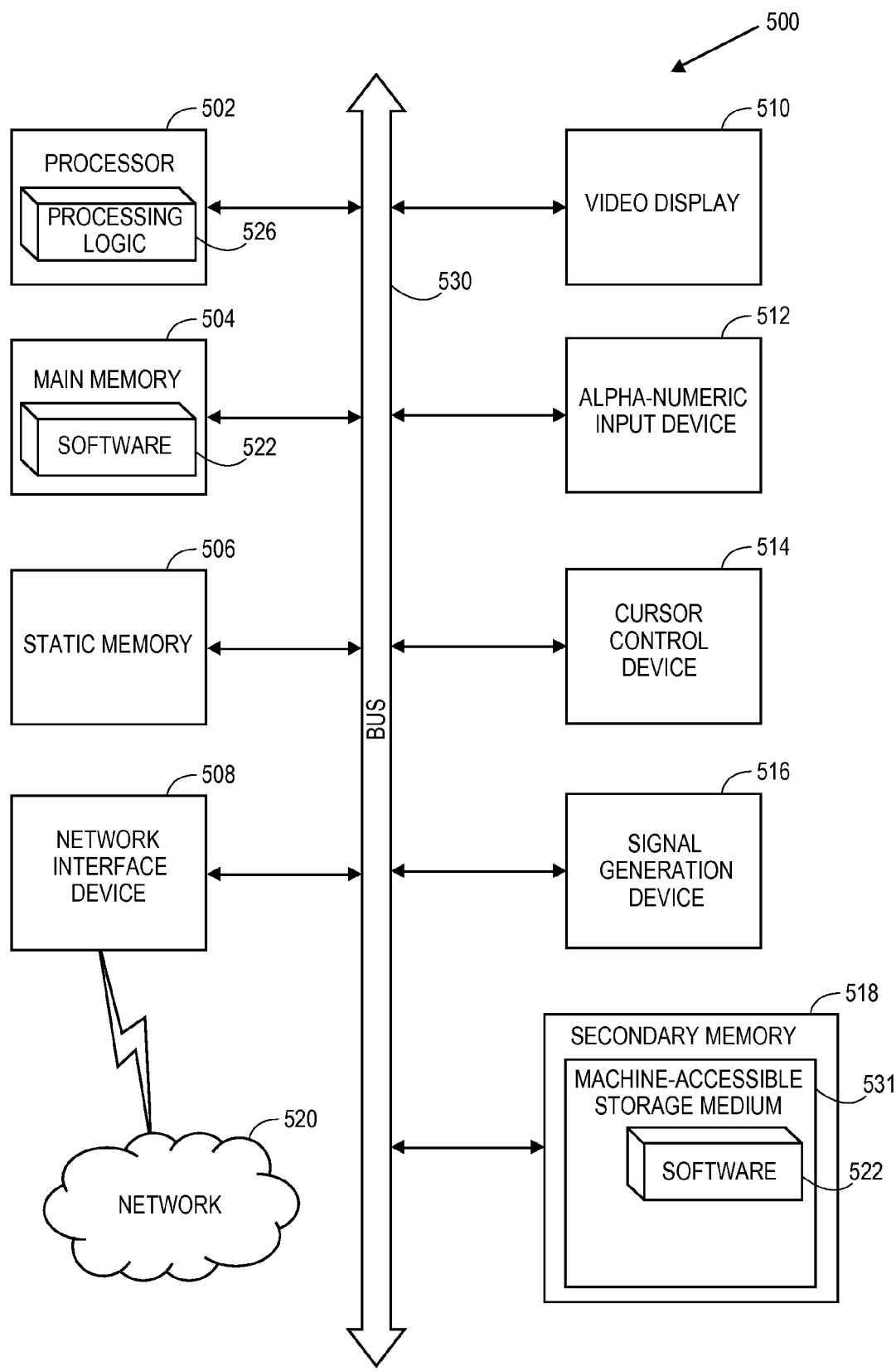
FIG. 5 illustrates a block diagram of an example of a computer system configured for writing to and erasing a non-volatile memory or for dynamically writing to and erasing a non-volatile memory, in accordance with an embodiment of the present invention.

FIG. 5 illustrates a diagrammatic representation of a machine in the form of a computer system 500 within which a set of instructions, for causing the machine to perform any one or more of the methodologies discussed herein, is executed. For example, in accordance with an embodiment of the present invention, FIG. 5 illustrates a block diagram of an example of a computer system configured for writing to and erasing a non-volatile memory or for dynamically writing to and erasing a non-volatile memory. In alternative embodiments, the machine is connected (e.g., networked) to other machines in a Local Area Network (LAN), an intranet, an extranet, or the Internet. In an embodiment, the machine operates in the capacity of a server or a client machine in a client-server network environment, or as a peer machine in a peer-to-peer (or distributed) network environment. In an embodiment, the machine is a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers or processors) that individually or jointly execute a set (or multiple sets) of instructions to perform any one or more of the methodologies discussed herein.

The example of a computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, in an embodiment, the processor 502 is a complex instruction set computing (CISC) microprocessor, reduced instruction set computing (RISC) microprocessor, very long instruction word (VLIW) microprocessor, processor implementing other instruction sets, or processors implementing a combination of instruction sets. In one embodiment, processor 502 is one or more special-purpose processing devices such as an application specific integrated circuit (ASIC), a field programmable gate array (FPGA), a digital signal processor (DSP), network processor, or the like. Processor 502 executes the processing logic 526 for performing the operations discussed herein.

In an embodiment, the computer system 500 further includes a network interface device 508. In one embodiment, the computer system 500 also includes a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

In an embodiment, the secondary memory 518 includes a machine-accessible storage medium (or more specifically a computer-readable storage medium) 531 on which is stored one or more sets of instructions (e.g., software 522) embodying any one or more of the methodologies or functions described herein. In an embodiment, the software 522 resides, completely or at least partially, within the main memory 504 or within the processor 502 during execution thereof by the computer system 500, the main memory 504 and the processor 502 also constituting machine-readable storage media. In one embodiment, the software 522 is further transmitted or received over a network 520 via the network interface device 508.

While the machine-accessible storage medium 531 is shown in an embodiment to be a single medium, the term "machine-readable storage medium" should be taken to include a single medium or multiple media (e.g., a centralized or distributed database, or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of embodiments of the present invention. The term "machine-readable storage medium" shall accordingly be taken to include, but not be limited to, solid-state memories, and optical and magnetic media.

In accordance with an embodiment of the present invention, a software layer manages the write commands and adds the erase slice to each write command. In an embodiment, the software layer also tracks the erase status and progress. Thus, in one embodiment, any of the methods described herein work by adding an erase slice to write commands and then tracking the erase status and progress. In that embodiment, the methods eliminate long latency erase time by dividing it into slices that can be managed and added to write operations. In embodiments related to dynamic erase slicing, a software layer is implemented to manage the time allocated to the erase time slice. In one embodiment, the software layer allows the erase time to be increased or decreased. In a specific embodiment, a software layer automatically increases or decreases the erase slice based on the current flash state of free versus dirty space. In that embodiment, the software layer indicates the free versus dirty space in the flash and generates a recommendation for setting the erase slice time. In an embodiment, slicing instructions are stored in the flash memory to which slicing is applied, and the slicing instructions are executed in that flash memory. In another embodiment, slicing instructions are stored in the flash memory to which slicing is applied, and the slicing instructions are executed in a RAM of a host processor associated with that flash memory.

In accordance with an embodiment of the present invention, a machine-accessible storage medium has instructions stored thereon which cause a data processing system to perform a method for writing to and erasing a non-volatile memory. In an embodiment, the method includes determining the size of a command window for use in n write operations for the non-volatile memory, each write operation having the same time period. The method further includes slicing a long latency erase command by a factor of n to provide a plurality of erase slices, each erase slice having the same time period. The method then includes executing n commands to the non-volatile memory, each command composed of the combination of one of the n write operations and one of the erase slices, wherein the total of the time period of one erase slice added to the time period of one write operation is less than or equal to the size of the command window.

In an embodiment of the machine-accessible storage medium, the total of the time period of one erase slice added to the time period of one write operation is less than the size of the command window. In an embodiment of the machine-accessible storage medium, the associated non-volatile memory is a NOR flash memory. In an embodiment of the machine-accessible storage medium, n is equal to 10, the size of the command window is approximately 72 milliseconds, the time period of one erase slice is approximately 70 milliseconds, and the time period of one write operation is approximately 2 milliseconds. In an embodiment of the machine-accessible storage medium, determining the size of the command window is performed dynamically and is based on a dynamic latency erase command and slicing the long latency erase command includes slicing the dynamic long latency erase command, the dynamic long latency erase command based on an actual state of the non-volatile memory. In one such embodiment including the dynamic latency erase command, the total of the time period of one erase slice added to the time period of one write operation is less than the size of the command window. In another such embodiment including the dynamic latency erase command, the non-volatile memory is a NOR flash memory. In one embodiment, n is equal to 10, the size of the command window is approximately 52 milliseconds, the time period of one erase slice is approximately 50 milliseconds, and the time period of one write operation is approximately 2 milliseconds. In another embodiment, n is equal to 10, the size of the command window is approximately 152 milliseconds, the time period of one erase slice is approximately 150 milliseconds, and the time period of one write operation is approximately 2 milliseconds. Thus, in accordance with an embodiment of the present invention, the size of each of a plurality of program windows is determined dynamically based on the actual state of the non-volatile memory to which the plurality of program commands is applied. For example, in one embodiment, there is a small erase backlog and the slice time can be reduced to provide a perceived improvement in performance of the program commands. In another embodiment, there is a large erase backlog and the slice time is increased to decrease the chance of a foreground erase event.

In accordance with an embodiment of the present invention, methods or approaches described herein can be implemented in association with a non-volatile memory, such as NOR flash, to eliminate the long latency of erase commands. In an embodiment, NOR flash configured to operate with erase slicing enables the use of such flash memory in applications that have a small command window, an aggressive power management, or limited or no time for background operations. In one embodiment, a fixed time slice is implemented. However, in another embodiment, dynamic slicing is implemented, which facilitates matching an erase time slice to the state of a flash memory. In that embodiment, the size (in absolute time) of the erase time slice is increased or decreased as needed. In one embodiment, increasing the erase time slice allocates more time to erase and allows a system to clean more space than a fixed time slice. In another embodiment, decreasing the time slice allows the system to appear more responsive to a system than a fixed time slice.

Thus, a computer-implemented method for writing to and erasing a non-volatile memory has been disclosed. In accordance with an embodiment of the present invention, the method includes determining the size of a command window for use in n write operations for the non-volatile memory, each write operation having the same time period. A long latency erase command is sliced by a factor of n to provide a plurality of erase slices, each erase slice having the same time period. The method further includes executing n commands to the non-volatile memory, each command composed of the combination of one of the n write operations and one of the erase slices. The total of the time period of one erase slice added to the time period of one write operation is less than or equal to the size of the command window. In one embodiment, the total of the time period of one erase slice added to the time period of one write operation is less than the size of the command window. In one embodiment, the non-volatile memory is a NOR flash memory.

What is claimed is:

1. A computer-implemented method for writing to and erasing a non-volatile memory, the method comprising:
   determining the size of a command window for use in n write operations for the non-volatile memory, each write operation having the same time period;
   slicing a long latency erase command by a factor of n to provide a plurality of erase slices, each erase slice having the same time period; and
   executing n commands to the non-volatile memory, each command comprised of the combination of one of the n write operations and one of the erase slices, wherein the total of the time period of one erase slice added to the time period of one write operation is less than or equal to the size of the command window.

2. The computer-implemented method of claim 1, wherein the total of the time period of one erase slice added to the time period of one write operation is less than the size of the command window.

3. The computer-implemented method of claim 1, wherein the non-volatile memory is a NOR flash memory.

4. The computer-implemented method of claim 1, wherein n is equal to 10, the size of the command window is approximately 72 milliseconds, the time period of one erase slice is approximately 70 milliseconds, and the time period of one write operation is approximately 2 milliseconds.

5. A computer-implemented method for writing to and erasing a non-volatile memory, the method comprising:
   dynamically determining the size of a command window for use in n write operations for the non-volatile memory, each write operation having the same time period, the dynamically determining based on a dynamic latency erase command;
   slicing the dynamic long latency erase command by a factor of n to provide a plurality of erase slices, each erase slice having the same time period, the dynamic long latency erase command based on an actual state of the non-volatile memory; and
   executing n commands to the non-volatile memory, each command comprised of the combination of one of the n write operations and one of the erase slices, wherein the total of the time period of one erase slice added to the time period of one write operation is less than or equal to the size of the command window.

6. The computer-implemented method of claim 5, wherein the total of the time period of one erase slice added to the time period of one write operation is less than the size of the command window.

7. The computer-implemented method of claim 5, wherein the non-volatile memory is a NOR flash memory.

8. The computer-implemented method of claim 5, wherein n is equal to 10, the size of the command window is approximately 52 milliseconds, the time period of one erase slice is approximately 50 milliseconds, and the time period of one write operation is approximately 2 milliseconds.

9. The computer-implemented method of claim 5, wherein n is equal to 10, the size of the command window is approximately 152 milliseconds, the time period of one erase slice is approximately 150 milliseconds, and the time period of one write operation is approximately 2 milliseconds.

10. The computer-implemented method of claim 5, wherein the actual state of the non-volatile memory comprises a small erase backlog, and wherein the dynamic latency erase command is approximately 500 milliseconds.

11. The computer-implemented method of claim 5, wherein the actual state of the non-volatile memory comprises a large erase backlog, and wherein the dynamic latency erase command is approximately 1500 milliseconds.

12. A machine-accessible storage medium having instructions stored thereon which cause a data processing system to perform a method for writing to and erasing a non-volatile memory, the method comprising:
   determining the size of a command window for use in n write operations for the non-volatile memory, each write operation having the same time period;
   slicing a long latency erase command by a factor of n to provide a plurality of erase slices, each erase slice having the same time period; and
   executing n commands to the non-volatile memory, each command comprised of the combination of one of the n write operations and one of the erase slices, wherein the total of the time period of one erase slice added to the time period of one write operation is less than or equal to the size of the command window.

13. The machine-accessible storage medium of claim 12, wherein the total of the time period of one erase slice added to the time period of one write operation is less than the size of the command window.

14. The machine-accessible storage medium of claim 12, wherein the non-volatile memory is a NOR flash memory.

15. The machine-accessible storage medium of claim 12, wherein n is equal to 10, the size of the command window is approximately 72 milliseconds, the time period of one erase slice is approximately 70 milliseconds, and the time period of one write operation is approximately 2 milliseconds.

16. The machine-accessible storage medium of claim 12, wherein determining the size of the command window is performed dynamically and is based on a dynamic latency erase command, wherein slicing the long latency erase command comprises slicing the dynamic long latency erase command, the dynamic long latency erase command based on an actual state of the non-volatile memory.

17. The machine-accessible storage medium of claim 16, wherein the total of the time period of one erase slice added to the time period of one write operation is less than the size of the command window.

18. The machine-accessible storage medium of claim 16, wherein the non-volatile memory is a NOR flash memory.

19. The machine-accessible storage medium of claim 16, wherein n is equal to 10, the size of the command window is approximately 52 milliseconds, the time period of one erase slice is approximately 50 milliseconds, and the time period of one write operation is approximately 2 milliseconds.

20. The machine-accessible storage medium of claim 16, wherein n is equal to 10, the size of the command window is approximately 152 milliseconds, the time period of one erase slice is approximately 150 milliseconds, and the time period of one write operation is approximately 2 milliseconds.

\* \* \* \* \*